United States Patent [19]

Ries et al.

[11] Patent Number: 5,363,078
[45] Date of Patent: Nov. 8, 1994

[54] HOMOGENEOUS FIELD MAGNET HAVING POLE SHOES WITH POLE PIECE MEANS WHICH ARE SPACED OVER A CORRECTION AIR GAP

[75] Inventors: Günter Ries, Erlangen; Horst Siebold, Effeltrich, both of Germany

[73] Assignee: Siemens Aktiengesellschaft, Munich, Germany

[21] Appl. No.: 209,031

[22] Filed: Mar. 9, 1994

[30] Foreign Application Priority Data

Mar. 15, 1993 [DE] Germany .................... 4308208.4

[51] Int. Cl.$^5$ .................... G01R 33/46; H01F 7/06
[52] U.S. Cl. .................... 335/297; 324/319
[58] Field of Search ............. 335/296, 297, 298, 301, 335/302, 303, 304, 305, 306; 324/318, 319, 320

[56] References Cited

U.S. PATENT DOCUMENTS

| | | | |
|---|---|---|---|
| 2,917,682 | 12/1959 | Kirchner et al. | 335/297 |
| 2,962,636 | 11/1960 | Purcell | 335/297 |
| 3,223,897 | 12/1965 | Sullivan | 335/297 |
| 3,253,194 | 5/1966 | Parker | 335/297 |
| 4,672,346 | 6/1987 | Miyamoto et al. | 335/296 |
| 4,675,609 | 6/1987 | Danby et al. | 324/318 |
| 5,278,534 | 1/1994 | Abele et al. | 335/306 |

FOREIGN PATENT DOCUMENTS

| | | |
|---|---|---|
| 0170318 | 2/1986 | European Pat. Off. . |
| 0284439 | 9/1988 | European Pat. Off. . |
| 0488015 | 6/1992 | European Pat. Off. . |
| 1439896 | 12/1970 | Germany . |
| 2259937 | 6/1974 | Germany . |
| 3737133 | 5/1989 | Germany . |
| 199403 | 8/1988 | Japan .................... 335/302 |
| 273602 | 12/1991 | Japan .................... 335/302 |

OTHER PUBLICATIONS

Journal of Scientific Instruments (Journal of Physics E), 1968, Series 2, vol. 1, E. Boltezar et al.: *A Permanent Magnet for a Nuclear Magnetic Resonance Spectrometer,* pp. 323–325.

Vacuumschmelze GmbH, Hanau, DE, Richard Boll: *Weichmagnetische Werkstoffe,* 4th Edition, 1990, pp. 278–279.

Patent Abstracts of Japan, vol. 11, No. 36, 3 Feb. 1987 & JP-A-61 203 605 (Fuji Electric Co., Ltd.), 9 Sep. 1986.

IEEE Transactions on Magnetics, vol. 28, No. 1, 1 Jan. 1992, New York, U.S., pp. 931–934, M. G. Abele et et al.: *Field Computation in Permanent Magnets.*

*Primary Examiner*—Leo P. Picard
*Assistant Examiner*—Raymond Barrera
*Attorney, Agent, or Firm*—Kenyon & Kenyon

[57] ABSTRACT

The magnet contains a magnetic yoke and two pole shoes between which a magnetic field of high homogeneity is formed. The pole shoes are provided with special pole piece device. Each pole piece device is spaced from a base part facing the yoke by a narrow correction air gap. In accordance with the invention, each pole piece device contains two plate-like pole piece elements which are parallel to each other and spaced apart by a gap of predetermined width. In this connection, the plate element facing the base part has a relative permeability ($\mu_r 1$) which is smaller by at least a factor of 5 than the plate element facing the useful volume, the relative permeability ($\mu_r 2$) of which element is at least 10,000.

20 Claims, 2 Drawing Sheets

HOMOGENEOUS FIELD MAGNET HAVING POLE SHOES WITH POLE PIECE MEANS WHICH ARE SPACED OVER A CORRECTION AIR GAP

BACKGROUND OF THE INVENTION

The present invention relates generally to a homogeneous field magnet having a yoke which conducts the magnetic flux and two opposing pole shoes between which there is formed a useful volume having a magnetic field of high homogeneity, each pole shoe being provided with a pole piece means which is spaced from a base part facing the yoke of the corresponding pole shoe by a narrow correction air gap and which contains at least two pole piece elements of different material which are parallel to each other. EP 0 488 015 A1 discloses such a homogeneous field magnet.

Homogeneous field magnets are necessary, in particular, for the production of magnetic base fields in systems for nuclear-magnetic-resonance tomography, imaging or spectroscopy. For this purpose, the magnetic field of such base field magnets must be sufficiently homogeneous in an imaging or exploration region (useful volume) and produce therein a predetermined magnetic induction $B_0$. In general to serve this purpose, superconductive coil systems are provided for magnetic inductions $B_0$ of more than 0.5 T. As compared with this, smaller magnetic inductions, $B_0 < 0.5$ T, can also be produced with normally conducting coils or permanent magnets. These last-mentioned magnets are frequently developed as so-called pole shoe magnets having a magnet yoke in the form of a "C" or "H". Between the pole faces of opposing pole shoes, there is then present the useful volume with the required field homogeneity. In particular, for the requirements of nuclear magnetic resonance tomography, the initially obtainable field homogeneity in the useful volume is insufficient due to unavoidable manufacturing tolerances. Rather, it must be possible to correct for these manufacturing tolerances in a finished magnet in order to be able successively to reduce the field error by an alternating sequence of field measurements and field corrections (i.e., the so-called "shim procedure").

The aforementioned EP-A discloses a pole shoe magnet in which the field is correctable via mechanical means. For this purpose, its pole shoes are formed of adjustable pole piece means in the region of its pole faces. Furthermore, the surfaces of the pole shoes which face the useful volume can be so profiled to compensate for edge effects which affect homogeneity.

In order to be able to align such pole piece means with respect to each other with sufficient accuracy and to correct field errors, none of the pole piece means in the known homogeneous field magnet are fastened directly to the magnetic yoke conducting a magnetic flux. Rather, each pole piece means is spaced from a base part of the pole shoe which faces the yoke by a narrow correction air gap, and the means are made suitable and/or flexible by special setting means. In this arrangement, the air gap acts as magnetic series resistance to homogenize inhomogeneities of flux density in flux conducting parts of the pole shoe upon passage into the corresponding pole piece means.

In accordance with one particular embodiment of the known homogeneous field magnet, each of its pole piece means can be formed by a stack-like construction consisting of two layer-like pole piece elements of approximately the same thickness, different soft-magnetic materials being used for these elements. The first pole piece element, which faces the correction air gap, can be formed, for instance, of at least one sheet of electroengineering consisting of an Fe-Si alloy, whereby sufficient flexibility of the element is to be assured. As compared with this, the second pole piece element, which faces the useful volume, can consist for instance of a soft-magnetic ferrite or a resin bonded iron powder. With a relative permeability $\mu_r \, (=\mu/\mu_0 = 1/\mu_0^* \, B/H)$ of about 1000 and a flux-carrying capacity $B_{max}$ of about 0.4 T to 0.5 T of the material of this second layer, this material advantageously has only a slight electrical conductivity. On the other hand, the first layer is to provide for good base-field homogeneity. For this purpose, it consists of a material having a relative permeability $\mu_r$ of between 1000 and 5000, with, at the same time, a high flux-carrying capacity $B_{max}$ of about 1.6 T.

Such pole-piece means also bear a magnetic field produced by pulsed gradient coils. It is then found, however, that a magnetic hysteresis of the pole-piece material leads to residual fields after a gradient pulse and to a non-linear current-field relationship. As a result, the quality of the image of known imaging processes, such as, for instance, the so-called turbo-spin-echo method, are impaired. The occurrence of hysteresis phenomena is also a cause of errors in the magnetic base field. Depending on whether an operating current is obtained from existing exciter coils of lower or higher values, a different spectrum of the field errors namely results. This fact makes a shim procedure for adjusting an optimum base field homogeneity difficult.

The present invention is directed to the problem of reducing these errors which lead to hysteresis to a harmless amount in a homogeneous field magnet having the features indicated above.

SUMMARY OF THE INVENTION

The present invention solves this problem by providing that the pole piece elements are spaced from each other by a gap of predetermined width and that, on each pole shoe, the pole piece element facing the base part consists of a material the relative permeability of which is less by at least a factor of 5 than the relative permeability of the material of the pole piece element facing the useful volume, which relative permeability amounts to at least 10,000.

The advantages obtained with this development of the homogeneous field magnet reside, in particular, in the fact that the highly permeable material of the pole piece element facing the useful volume exhibits only slight hysteresis. This pole piece element bears essentially the magnetic gradient flux, which accordingly is affected only to a correspondingly slight extent by residual errors after a gradient pulse. As compared with this, the radial flux distribution of the magnetic base field is taken over essentially by the pole piece element which faces the base part of the pole shoe. In this element, hysteresis effects play only a subordinate role. Between the two pole piece elements the gap is present as a magnetic decoupling means. This gap prevents the radial flux in the pole piece element facing the base part from passing into the highly permeable material of the plate element which lies in parallel to it and from being able to magnetically saturate it. Therefore, for these pole piece elements one can advantageously use known highly permeable material which have a relatively lower magnetic saturation induction $B_S$ than the materials of the pole piece elements facing the base part.

DETAILED DESCRIPTION

A homogeneous field magnet in accordance with the present invention proceeds from known embodiments such as are provided, for instance, for nuclear-magnetic-resonance tomography (see, for instance, the aforementioned EP-A or Federal Republic of Germany OS 37 37 133, which are hereby incorporated by reference). Parts of the magnet which are not further explained therefore correspond to those of these known embodiments.

Figure 1:
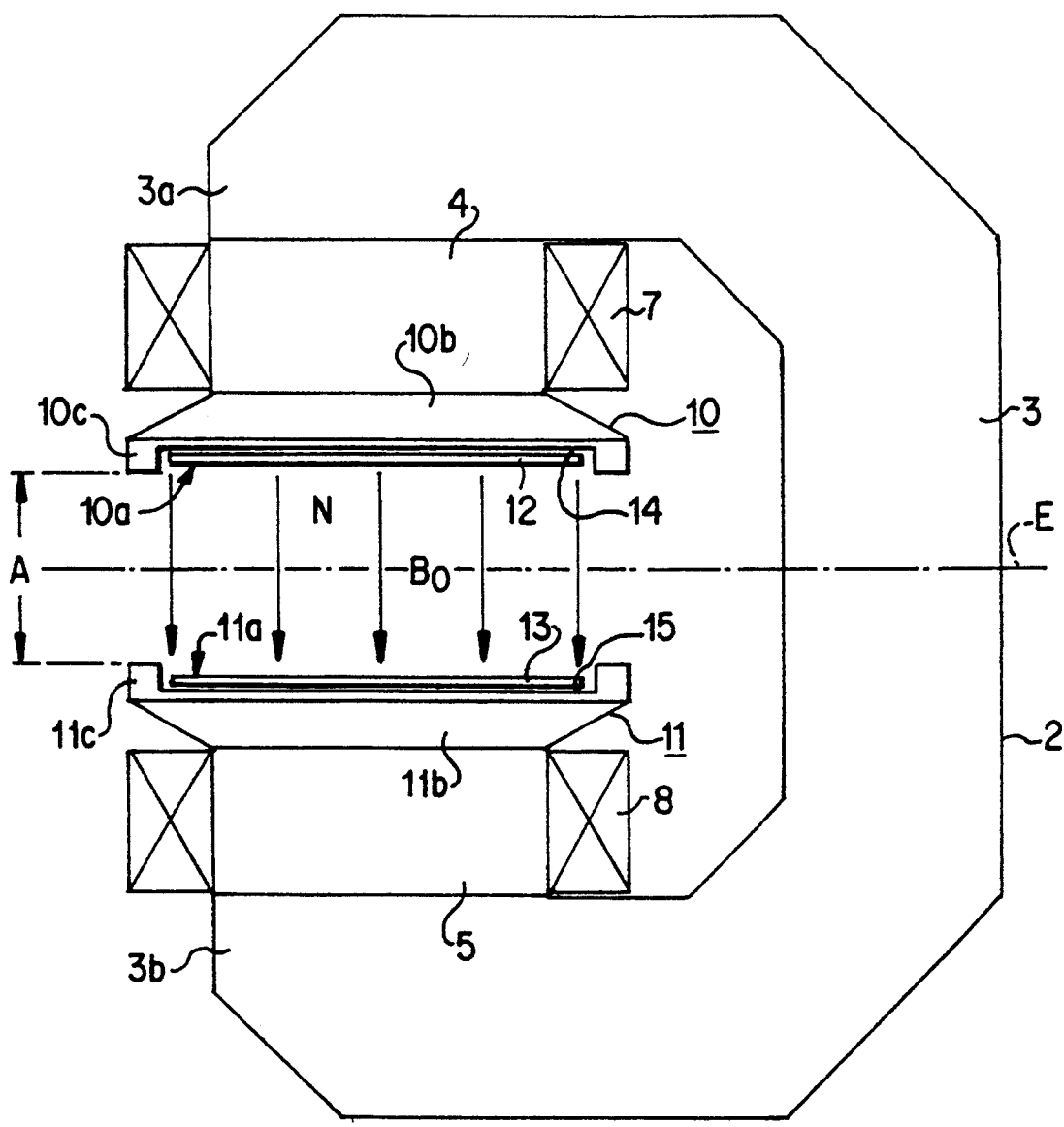
FIG. 1 shows an embodiment in principle of a homogeneous field magnet.

The homogeneous field magnet shown in diagrammatic longitudinal section of FIG. 1 is designated generally as 2. It has a single-arm magnetic yoke 3 made of iron, for example, which is arranged in the form of a "C". The two opposite, free arm ends 3a and 3b of the yoke 3 debouch in each case in an at least approximately cylindrical core 4 and 5, respectively, of ferromagnetic material. Each of these cores, which lead to each other, is surrounded by its own exciting coil 7 and 8, respectively. On the sides facing away from the arm ends 3a and 3b, the two cores 4 and 5 pass into a widening pole shoe 10 and 11, respectively. In this way, there is obtained a construction of the entire magnet 2 which is at least substantially symmetrical to a plane of symmetry E.

Between the pole faces 10a and 11a of the two pole shoes 10 and 11, a space or useful volume N is developed. Within this useful volume there is to be produced a homogeneous magnetic field with a magnetic induction $B_0$ which is sufficient for nuclear magnetic resonance tomography produced by the two exciter coils 7 and 8.

Each of the pole shoes 10 and 11 contains a base part 10b and 11b, respectively, which conduct magnetic flux, they being connected via the corresponding core 4 or 5 to the yoke 3. Each base part 10b and 11b has a free surface which is practically flat except for a region at its edge and has in the region of its edge a bead-like edge piece 10c and 11c, respectively, which reduces the distance apart A. These annular edge pieces serve for the field correction. In each inner central region of the pole shoe which is bordered by these edge pieces, there is arranged a special pole piece means 12 or 13 developed in accordance with the invention. Each of the these pole piece means 12 and 13 is in this connection spaced from the associated base part 10b and 11b respectively by a narrow axial correction air gap 14 and 15 respectively. Furthermore, gradient coils not shown in the figure, for the production of pulsed gradient fields necessary for the nuclear magnetic resonance tomography are located in general in the direct vicinity of those surfaces 10a and 11a of the pole piece means 12 and 13 which face the useful volume N.

Figure 2:
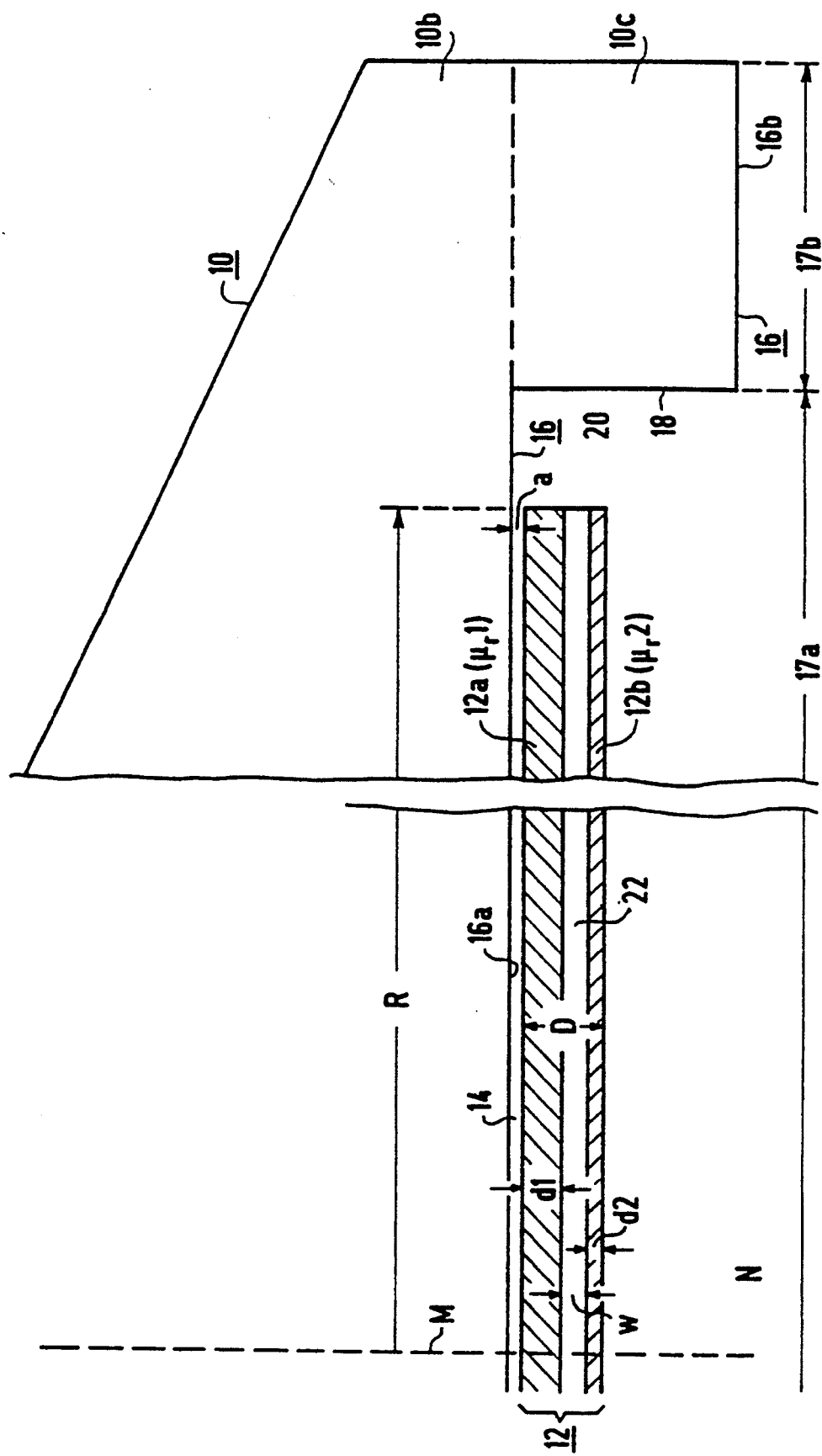
FIG. 2 shows an enlarged portion of a pole shoe of this magnet developed in accordance with the invention.

The development of the pole piece means of the invention can be noted from the diagrammatic longitudinal section shown in FIG. 2. This figure shows an enlarged portion from a part of one of the two pole shoes of the magnet 2 of FIG. 1, for instance of the pole shoe 10. Corresponding development features are also to be provided for the pole shoe 11.

From the sectional view shown in FIG. 2 through a part of the pole shoe 10, which has rotational symmetry to a center line M, there can be noted the base part 10b which has a substantially trapezoidal sectional surface and a stepped surface 16. This surface is divided into a central surface part 16a of a middle, central pole region 17a and into an outer surface part 16b of an edge region 17b. Between these two regions a step 18 is developed so that an edge piece 10c of the base part results. The edge piece can, for instance, have a trapezoidal or else a rectangular cross sectional surface. It can be developed integral with the base part 10b or be attached as a separate part to the base part. The base part can, however, also be profiled differently.

In the middle, central pole region 17a, the pole piece means 12 is arranged separated from the surface part 16a by a narrow axial correction air gap 14 of the width "a". In this connection, a radial gap 20 should remain between the outer edge of the pole piece means and the edge piece 10c. Adjustment means for the fixing as well as the tilting and/or bending of the pole piece means 12 are well known (see, for instance, the aforementioned Federal Republic of Germany OS 37 37 133, which is hereby incorporated by reference). They have therefore been omitted in the drawing.

The entire pole piece means 12 (and in corresponding manner also the entire pole piece means 13 of pole shoe 11) has in general a rectangular cross-sectional surface, it being relatively thin as compared with its radius R. Thus, its constant thickness D is in general between 0.3 and 3 cm, and preferably between 5 and 15 min. The pole piece means 12 is to be divided, in accordance with the invention, into two plate-like pole piece elements 12a and 12b which are aligned parallel to each other and are spaced apart by a gap 22 of the width "w". In this connection, the pole piece element 12a facing the base part 10b is to consist of a soft-magnetic material the relative permeability $\mu_r 1$ of which is smaller by at least a factor of 5, and preferably by at least a factor of 10, than the relative permeability $\mu_r 2$ of the soft-magnetic material which is provided for the pole piece element 12b facing the useful volume N. The relative permeability $\mu_r 2$ should in this connection be at least 10,000, and preferably at least 50,000. As can furthermore be noted from FIG. 2, the two pole piece elements 12a and 12b are also of different thicknesses d1 and d2, d1 being greater than d2. The thickness d1 of the pole piece element 12a is in this connection generally between 3 and 25 mm while a thickness d2 of between 1 and 5 mm is generally selected for the pole piece element 12b. The pole piece element 12a, which is thus thicker, takes over essentially the radial flux distribution of the magnetic base field. It should therefore consist of a material having a sufficiently high magnetic saturation induction $B_S$. Therefore, pure iron ($B_S$ approximately equal to 1.8 T) or Fe-Si alloys with Si contents of between 2 and 7 atom % ($B_s > 1.5$ T) are preferably suitable for this. These materials have a relative permeability $\mu_r 1$ which is in general between 1000 and 5000. As compared with this, the magnetic gradient flux produced by the gradient coils is assumed essentially by the thinner pole piece element 12b of the highly permeable material. For the suppression of hysteresis effects, materials of particularly low magnetic coercive field strength $H_c$ are to be selected, in particular with $H_c \leq 0.05$ A/cm. Materials which satisfy these requirements are, in particular, special Fe-Ni alloys having an Ni content of between 40 and 85 atom%. Examples of suitable alloys are the materials bearing the trade names "MUMETALL" (with 72 to 83 atom% Ni) and "PERMENORM 5000" (with 45 to 50 atom% Ni) produced by "Vacuumschmelze GmbH" of Hanau, Federal Republic of Germany (see also the book of this company entitled "Weichmagnetische Werkstoffe" ("Softmagnetic materials"), 4th Edition, 1990, pages 278 and 279, which are hereby incorporated by reference).

It is essential for the homogeneous magnet of the present invention that there be a sufficient width "w" of the gap 22 in order to assure sufficient magnetic uncoupling between the two pole piece elements 12a and 12b. Otherwise, namely, radial magnetic flux from the pole piece element 12a would pass into the highly permeable pole piece element 12b and magnetically saturate the latter. In other words, saturation of the highly permeable material of the pole piece element 12b as a result of a magnetic field strength H caused by the pole piece element 12a must be prevented and therefore a magnetic short circuit avoided. The source of the field strength H can in this connection be the radial magnetic flux in the pole piece element 12a or the coercive field strength $H_c$ of its material. By summation of the magnetic flux passing from the pole piece element 12a into the pole piece element 12b, assuming the condition $\int Hds = 0$, the following estimate can be made for the radial magnetic flux density passing into the pole piece element 12b:

$$B' = \mu_0 * H_c * R^2/(8 * w * d2)$$

In this equation, B' is the magnetic induction caused in the pole piece element 12b. B' should in this connection amount to at most about 1/5 to 2/3, and preferably $\frac{1}{3}$ to $\frac{1}{2}$, of the saturation induction $B_s'$ of the material of this pole piece element. $H_c$ is the coercive field strength of the material of the pole piece element 12a. $\mu_0$ is the universal magnetic field constant.

From the above estimate, taking as basis the materials provided in accordance with the invention and customary dimensions of the pole piece elements 12a and 12b, we have for the gap width w: $1 \text{ mm} \leq w \leq 6 \text{ mm}$.

Example

R of the pole piece elements 12a and 12b: 0.4 m.
$H_c$ of FeSi (3 atom%) alloy of the pole piece element 12a: 0,5 A/cm
d2 of the pole piece element 12b: 2 mm.
B' of FeNi (72-83 atom%, additions of Cu, Mo, etc.) alloy (for
instance "MUMETALL") of the pole piece element 12b: 0.2 T
(approx. ($\frac{1}{4}$) * $B_s'$).

There is then obtained a value for the gap width of w approx. 4 min. The pole piece element 12b can in this connection carry a magnetic flux of $4 \times 10^4$ Vs/m, which is produced by a magnetic field gradient of 10 mT/m.

The slot 22 between the pole piece elements 12a and 12b can advantageously be filled by a plate of plastic or of a non-magnetic metal, for instance aluminum or copper. A compact, easily handled part can then be formed as pole piece means from the stack of plates consisting of the elements 12a, 12b and the plate filling the gap 22 by bonding or by a plurality of thin, non-magnetic screws.

Differing from the embodiment of a homogeneous field magnet in accordance with the invention which is shown in the figures, the magnet may also have a different shape, for instance the shape of a "H". Furthermore, its pole piece elements can of course also be laminated. In addition, the width a of the correction air gaps 14 and 15 need not be constant in radial direction. (See the aforementioned EP-A, which is hereby incorporated by reference.)

What is claimed is:

1. A homogeneous field magnet comprising:
   a) a yoke conducting magnetic flux;
   b) two opposing pole shoes being magnetically coupled to the yoke, wherein between the two opposing pole shoes a useful volume having a magnetic field of high homogeneity is defined, and each pole shoe has a base part facing the yoke; and
   d) two pole piece means, each being spaced from the base part of one of the pole shoes by a narrow correction gap, wherein each of said pole piece means comprises:
      (i) a first pole piece element facing the base part, and being made of a first material with a first relative permeability; and
      (ii) a second pole piece element facing the useful volume, and being made of a second material with a second relative permeability, wherein the first and second pole piece elements are disposed parallel to each other and are spaced apart by a gap of a predetermined width, the first relative permeability is smaller by at least a factor of 5 than the second relative permeability, and the second relative permeability is at least 10,000.

2. The magnet according to claim 1, wherein the first relative permeability is smaller by at least a factor of 10 than the second relative permeability.

3. The magnet according to claim 1, wherein second relative permeability is at least 50,000.

4. The magnet according to claim 2, wherein second relative permeability is at least 50,000.

5. The magnet according to claim 1, wherein the first and second pole piece elements of each pole shoe have different thicknesses.

6. The magnet according to claim 2, wherein the first and second pole piece elements of each pole shoe have different thicknesses.

7. The magnet according to claim 3, wherein the first and second pole piece elements of each pole shoe have different thicknesses.

8. The magnet according to claim 5, wherein a thickness of the first pole piece elements is between 3 and 25 mm.

9. The magnet according to claim 6, wherein a thickness of the first pole piece elements is between 3 and 25 mm.

10. The magnet according to claim 5, wherein a thickness of the second pole piece elements is between 1 and 5 mm.

11. The magnet according to claim 8, wherein a thickness of the second pole piece elements is between 1 and 5 mm.

12. The magnet according to claim 1, wherein the gap between the first and second pole piece elements has a width between 1 and 6 mm.

13. The magnet according to claim 2, wherein the gap between the first and second pole piece elements has a width between 1 and 6 mm.

14. The magnet according to claim 1, wherein the gap between the first and second pole piece elements is filled with a non-magnetic material.

15. The magnet according to claim 2, wherein the gap between the first and second pole piece elements is filled with a non-magnetic material.

16. The magnet according to claim 1, wherein the first pole piece elements comprise an Iron-Silicon alloy having a Silicon content of between 2 and 7 atom%.

17. The magnet according to claim 2, wherein the first pole piece elements comprise an Iron-Silicon alloy having a Silicon content of between 2 and 7 atom%.

18. The magnet according to claim 3, wherein the first pole piece elements comprise an Iron-Silicon alloy having a Silicon content of between 2 and 7 atom%.

19. The magnet according to claim 1, wherein the second pole piece elements comprise an Iron-Nickel alloy having a Nickel content of between 40 and 85 atom%.

20. The magnet according to claim 2, wherein the second pole piece elements comprise an Iron-Nickel alloy having a Nickel content of between 40 and 85 atom%.

* * * * *